(12) United States Patent
Sebastián Martín et al.

(10) Patent No.: US 10,193,272 B2
(45) Date of Patent: Jan. 29, 2019

(54) ADAPTER FOR ELECTRICAL CONNECTION BUSHINGS

(71) Applicant: ORMAZABAL Y CÍA, S.L.U., Igorre (ES)

(72) Inventors: Sergio Sebastián Martín, Igorre (ES); Luis Ranedo Torres, Igorre (ES); Joseba Arostegui Legarreta, Igorre (ES); José Luis Sabas Fernández, Igorre (ES)

(73) Assignee: ORMAZABAL Y CIA, S.L.U., Igorre (Vizcaya) (ES)

( * ) Notice: Subject to any disclaimer, the term of this patent is extended or adjusted under 35 U.S.C. 154(b) by 0 days.

(21) Appl. No.: 15/532,356

(22) PCT Filed: Dec. 1, 2014

(86) PCT No.: PCT/ES2014/070884
§ 371 (c)(1),
(2) Date: Jun. 1, 2017

(87) PCT Pub. No.: WO2016/087685
PCT Pub. Date: Jun. 9, 2016

(65) Prior Publication Data
US 2017/0331220 A1    Nov. 16, 2017

(51) Int. Cl.
*H01R 13/53* (2006.01)
*G01R 15/14* (2006.01)
(Continued)

(52) U.S. Cl.
CPC ............. *H01R 13/53* (2013.01); *G01R 15/14* (2013.01); *H01R 13/6683* (2013.01);
(Continued)

(58) Field of Classification Search
CPC .... H01R 13/53; H01R 13/6485; H01R 13/03; H01R 13/6666
See application file for complete search history.

(56) References Cited

U.S. PATENT DOCUMENTS

| 4,131,329 A | 12/1978 | Flatt |
| 5,445,533 A * | 8/1995 | Rosciewski .......... H01R 13/53 439/184 |

(Continued)

FOREIGN PATENT DOCUMENTS

| CN | 203367497 | 12/2013 |
| DE | 295 08 111 U1 | 8/1995 |

(Continued)

OTHER PUBLICATIONS

Apr. 5, 2017 Notification of Transmittal of the International Preliminary Report on Patentability (PCT Rule 71.1) in connection with International Application No. PCT/ES2014/070884.

(Continued)

*Primary Examiner* — Xuong Chung Trans
(74) *Attorney, Agent, or Firm* — Gary J. Gershik; Cooper & Dunham LLP

(57) ABSTRACT

Enables an electrical connection to be made in an insulated, shielded manner that makes it possible to sense a voltage presence signal, between the cable (3) and the electrical equipment with a female bushing (4) without the need to substitute or modify the high-voltage electrical equipment (2), only adding fastening elements for the adapter (1). Said adapter (1) comprises a body (6) of insulating material, equipped with a first connection end (8) configured to couple in a sealed manner into said at least one female bushing (4) of the high-voltage electrical equipment (2) and with a second connection end (9) configured to couple to the female terminal (5) of the cable (3).

13 Claims, 3 Drawing Sheets

(51) Int. Cl.
*H01R 13/66* (2006.01)
*H01R 31/06* (2006.01)
*H02B 13/035* (2006.01)
*H01R 101/00* (2006.01)

(52) U.S. Cl.
CPC ....... *H01R 31/065* (2013.01); *H02B 13/0358* (2013.01); *H01R 2101/00* (2013.01)

(56) References Cited

U.S. PATENT DOCUMENTS 6,976,862 B1 * 12/2005 Ormazabal Ocerin ...................... H01R 13/18
439/246
9,461,387 B2 * 10/2016 Heilersig ............... H01R 13/40

FOREIGN PATENT DOCUMENTS

| EP | 0 917 157 A2 | 5/1999 |
| EP | 2 654 133 A1 | 10/2013 |
| ES | 2 379 241 T3 | 4/2012 |
| WO | WO 2002/35668 | 5/2002 |
| WO | WO 2010/111808 | 10/2010 |
| WO | WO 2012/080522 | 6/2012 |

OTHER PUBLICATIONS

International Search Report issued by the International Searching Authority (ISA/O.E.P.M.) dated Aug. 19, 2015 in connection with International Application No. PCT/ES2014/070884.

\* cited by examiner

ADAPTER FOR ELECTRICAL CONNECTION BUSHINGS

RELATED APPLICATIONS

This application is a § 371 national stage of PCT International Application No. PCT/ES2014/070884, filed Dec. 1, 2014, the contents of each of which are hereby incorporated by reference into this application.

OBJECT OF THE INVENTION

The present invention relates to the field of the distribution and transformation of electric energy, and more specifically to an adapter with application in a connection point between high-voltage electrical equipment with a female electrical connection bushing and a cable with a terminal, enabling an electrical connection to be made in an insulated, shielded manner that makes it possible to sense a voltage presence signal, between the cable and the electrical equipment with a female bushing without the need to substitute or modify the high-voltage electrical equipment, only adding fastening elements for the adapter.

BACKGROUND OF THE INVENTION

The high-voltage electrical equipment or cells used in electrical energy distribution facilities to maneuver and/or protect the electricity grid, are usual modular and/or compact, such that by using a coupling system, such as the one published in document WO235668A1, for example, this electrical equipment may be expanded and therefore any high-voltage electrical arrangement may be obtained.

This expandable electrical equipment or cells have female electrical connection bushings or sockets on their sides, which facilitate the connection between their main bar systems by means of the aforementioned coupling system. In an installation with a plurality of pieces modular electrical equipment connected to one another, the first and/or last piece of electrical equipment in the installation constitutes the connection and/or output of the installation. This connection or outlet of the installation is generally carried out by means of cables with terminals (T- or elbow terminals), which connect to male electrical connection bushings. Given that electrical equipment installed side-by-side comprises female electrical connection bushings, the first and/or last piece of electrical equipment in the installation must have a male electrical connection bushing for the connection and/or output of the installation via cables with terminals.

In an existing on-site installation, it is necessary to give continuity to the electric circuit by connecting to another installation, for example a transformer substation. For this reason, the last piece of electrical equipment must have, on the appropriate side, a male bushing in order to connect the output cables equipped with terminals, or add on another piece of electrical equipment, which involves an added cost. On the whole, all of this involves significant work that includes breakdown and setup time, the sum of costs stemming from labor and from the new electrical equipment with male bushings that must be installed, as well as certain disadvantages from the point of view of logistics, such as increasing the reference quantity and managing product stock. If it is not installed on-site, this means bearing in mind all of these constraints and details when ordering electrical equipment, since some will have female bushings and others male bushings.

Once there is a male bushing on one side of the piece of electrical equipment, it would be necessary to install the cables with connectors (terminals) inside a piece of air-insulated electrical equipment, called a cable riser.

In installations such as wind farms, where the transformer substation may be located inside the mast of the wind turbines, the installation, operation and maintenance of the electrical equipment is conditioned by the width of the door to the tower and by the space available inside it. Therefore, installing this electrical equipment with male bushings along with the cable riser cell could make accessing the inside of the tower problematic, since, due to the narrow width of the tower doors, there are significant limitations for putting in and taking out electrical equipment with male bushings.

Other times, instead of arranging the last piece of electrical equipment or cell with male bushings, the cells with female bushings are maintained, and new electrical equipment called a bus riser cell is installed, which connects to the last cell by means of the aforementioned coupling system. With this gas-insulated bus riser cell it is possible to connect the main bar system to the next installation, making a cable output (with the possibility of including surge arresters) to the next installation.

Moreover, the installation of a new piece of electrical equipment with female bushings and a bus-riser cell involves a higher cost than installing a cable-riser cell, as the latter is a modular air-insulated cell that houses the connection or output cables with terminals, which means that the first and/or last piece of electrical equipment in the installation has to have a male electrical connection bushing.

Also, due to the need to employ electrical equipment with male electrical connecting bushings, for example in order to provide an input or continuity to an installation that forms part of an electric circuit, in addition to standard electrical equipment, i.e. electrical equipment where at least one of the walls comprises at least one female electrical connection bushing, there must be a stock of electrical equipment on hand with both bushing solutions (male and female), which further complicates the whole set of materials and methods necessary to carry out the logistics, for example in terms of activities related to purchasing, production, transportation, storage, maintenance and distribution.

The voltage and current in high-voltage electrical equipment can be measured in the cable compartment through plug-in terminals, for example T-terminals, which may incorporate a capacitive or resistive voltage sensor and an inductive current sensor. To connect these terminals to the voltage and current sensors, the electrical equipment must also have male bushings. The voltage and current may also be measured in the main bar system, and as such, in an installation with standard modular electrical equipment comprising female bushings, measuring the voltage and intensity in the bars entails installing a new piece of electrical equipment or an air-insulated measuring cell, which incorporates voltage and current transformers.

Along these lines, we can cite examples such as those described in the documents WO2010111808A1 and WO2012080522A1, which relate to a connection device between electrical equipment insulated in different media (gas-air). This connection device consists of an insulator comprising a portion which is coupled to a gas-insulated cell and another portion which is coupled to an air-insulated cell, which may be the measuring cell with the voltage and current transformers. But in this case as well, installing a new piece of electrical equipment (a measuring cell) entails space issues in installations with size constraints, as well as driving up costs.

DESCRIPTION OF THE INVENTION

The present invention resolves the foregoing drawbacks by providing an insulated high-voltage adapter envisaged for use in a connection point between high-voltage electrical equipment with a female electrical connection bushing and at least one cable with a terminal, enabling an electrical connection with a high degree of protection (insulated and shielded), and simultaneously a connection that can supply voltage and current values at the connection point.

Specifically, the invented adapter is installed between the electrical equipment and the cable, and more specifically in a connection element located in the standard high-voltage electrical equipment, this being a female electrical connection bushing arranged in at least one side wall of the high-voltage electrical equipment, such that it remains sealed and maintains the characteristics of the original electrical equipment with female bushings.

The adapter comprises at least one body of insulating material, in turn comprising a first connection end configured to couple in a sealed manner to the female electrical connection bushing of the high-voltage electrical equipment; and a second connection end configured to couple to the female terminal of the cable to be connected to the high-voltage electrical equipment.

Furthermore, preferably, the invented adapter comprises at least one connector corresponding to at least one conductive terminal of said female bushing of the high-voltage electrical equipment. This connector is configured to be connected to the conductive terminal of said female bushing when the first end of the insulating body is coupled in a sealed manner in the female bushing. The connector comprises at least one conductive part, such that the electrical connection between said at least one conductive part and the conductive terminal is of the plug-in type, this electrical connection being inside the insulating body. Therefore, the connection between the first end of the insulating body and the female bushing of the high-voltage electrical equipment is of the plug-in type, and therefore the invented adapter is independent of said electrical equipment, maintaining the seal and all of the characteristics of this electrical equipment, since it does not undergo any modification.

The conductive parts are mounted inside of at least one conductive tube that is housed or encapsulated in the insulating body, with the possibility of said parts being able to pivot with respect to the insulating body, and being able to move axially to be coupled on the conductive terminals provided inside the female bushings, even when they are misaligned. Likewise, the conductive parts are mounted axially and in respective openings provided radially in a conductive ring. The conductive parts are tightened against the conductive terminals by means of at least one elastic element, ensuring suitable electrical contact between said terminals and the conductive parts.

As for the second connection end, it comprises at least one encapsulated conductive bar that is connected to at least one conductive part of the connector. The conductive parts are tightened against the conductive bar by means of at least one elastic element, ensuring suitable electrical contact between said bar and the conductive parts. The connection point of the at least one conductive part with the conductive terminal, as well as with the conductive bar, is then located inside said conductive tube.

Therefore, the adapter independent from the high-voltage electrical equipment and the cable to be joined, enables the on-site execution of a direct and quick electric connection/disconnection between main bar system of the electrical equipment and cables, said adapter being able to be coupled to standard equipment, i.e. electrical equipment comprising in at least one of the walls thereof at least one female connection bushing. This avoids the need to substitute or modify the first and/or last piece of electrical equipment in the installation so as to be able to provide continuity between the main bar system and another installation, as well as space issues in installations with size constraints, logistical problems, etc.

For the purpose of controlling the electric field, the first connection end of the insulating body can internally comprise (on its inner face) a first conductive coating applied at least partially on said inner face, and in contact with the conductive tube of the connector. This way, any air gap which might remain inside the insulating body is electrically shielded, so it is not subjected to any electric field which might generate the inception of partial discharges. Likewise, the outside of the first connection end is at least partially coated with a second conductive coating that is grounded. The adapter may also comprise at least one means for controlling the electric field, mounted at the point where the first connection end, the second connection end and the conductive tube of the connector converge. This means for controlling the electric field is at the same potential as the conductive tube.

The adapter comprises at least one fastening element, which, once the first connection end couples in a sealed manner into the female electrical connection bushing of the high-voltage electrical equipment, enables the adapter to be attached on a wall of the high-voltage electrical equipment.

Also envisaged is the possibility of the adapter being able to comprise at least one current sensor, such as a toroidal inductive sensor mounted on the second connection end to measure current, as well as at least one voltage sensor encapsulated in the second connection end of the insulating body to measure voltage and/or tap voltage to power electronic equipment, such as relays.

DESCRIPTION OF THE DRAWINGS

In order to complement the description being made and with the object of helping to better understand the characteristics of the invention, in accordance with a preferred practical embodiment thereof, said description is accompanied, as an integral part thereof, by a set of drawings where, in an illustrative and non-limiting manner, the following has been represented.

PREFERRED EMBODIMENT OF THE INVENTION

What follows is the description of a preferred exemplary embodiment with reference to the aforementioned figures, which, however, shall not limit or reduce the scope of protection of the present invention.

Figure 1:
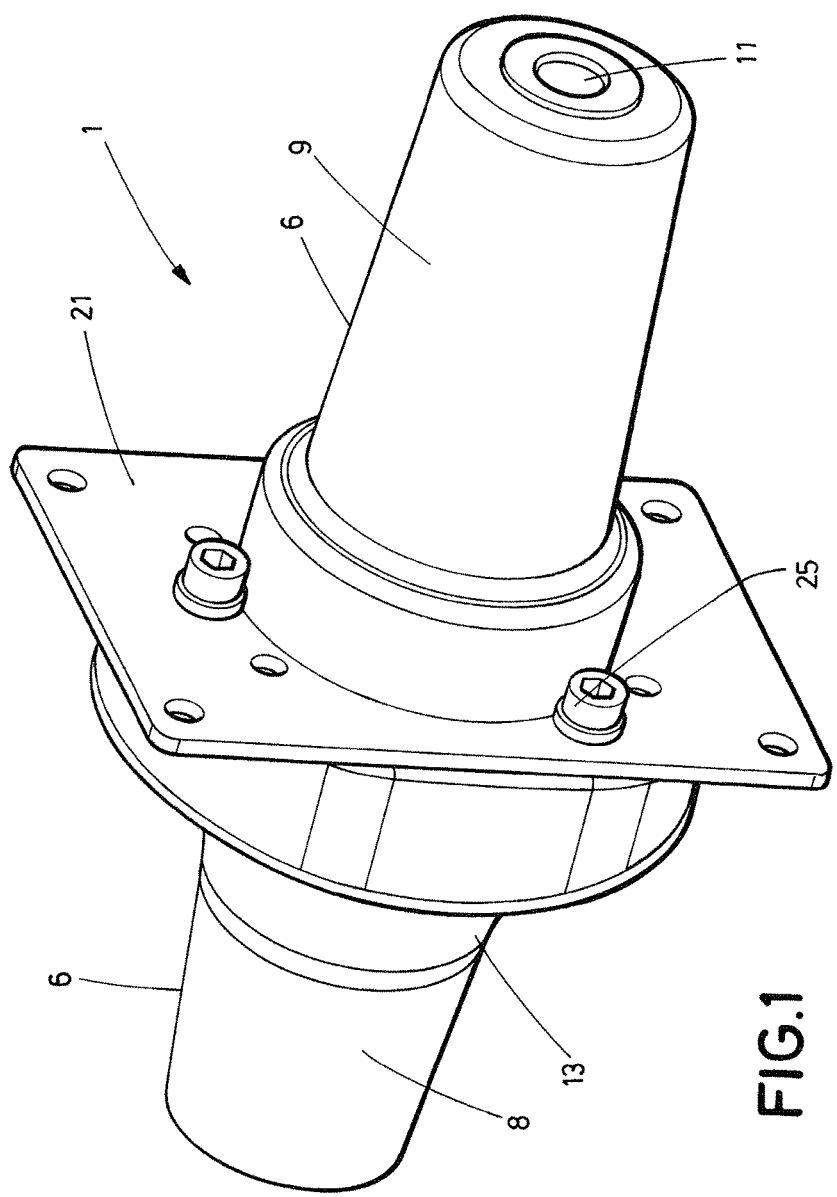
FIG. 1 shows a perspective view of the invented adapter for electrical connection bushings.
Figure 2:
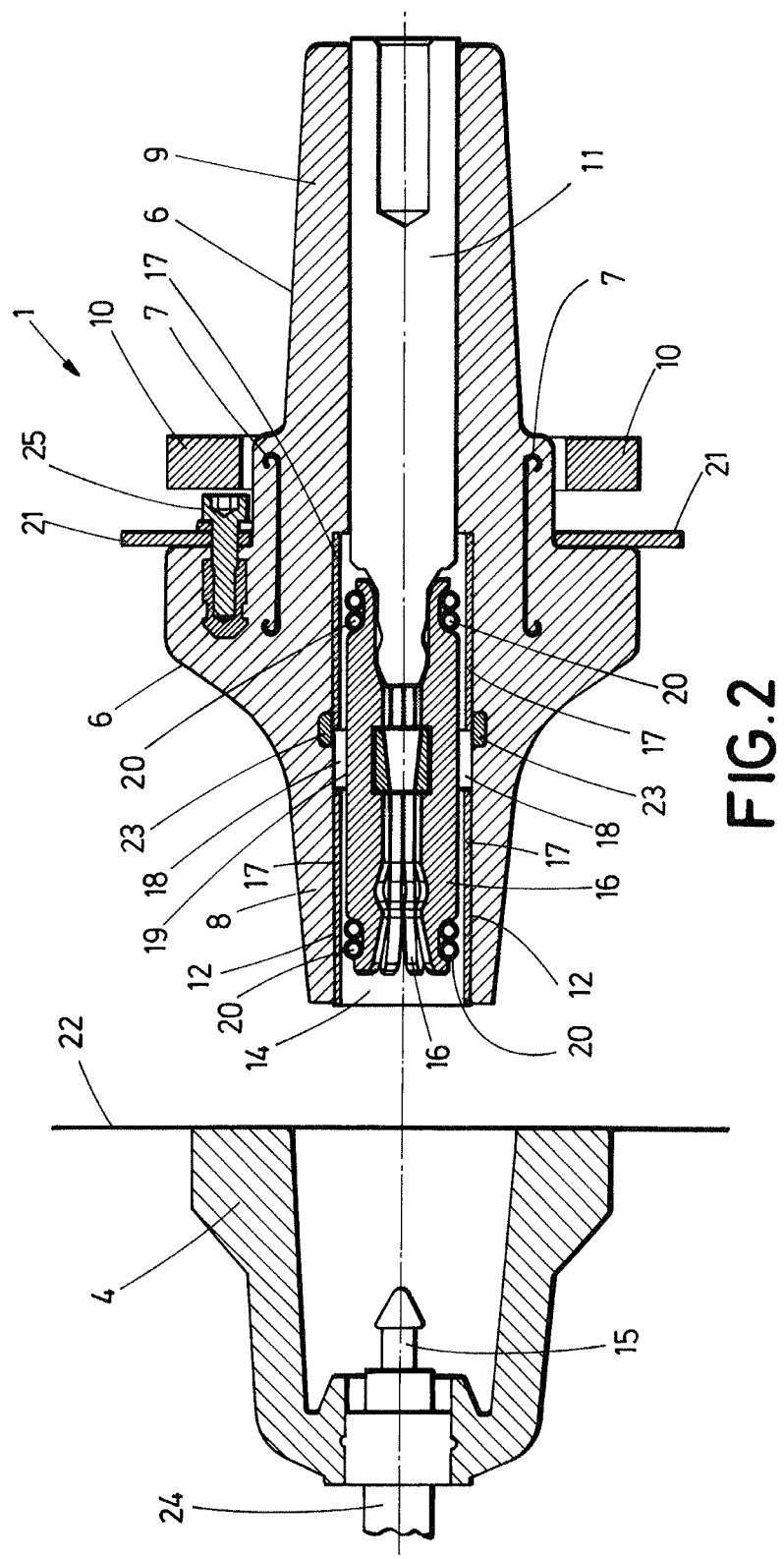
FIG. 2 shows a cross-sectional view of the invented adapter.
Figure 3:
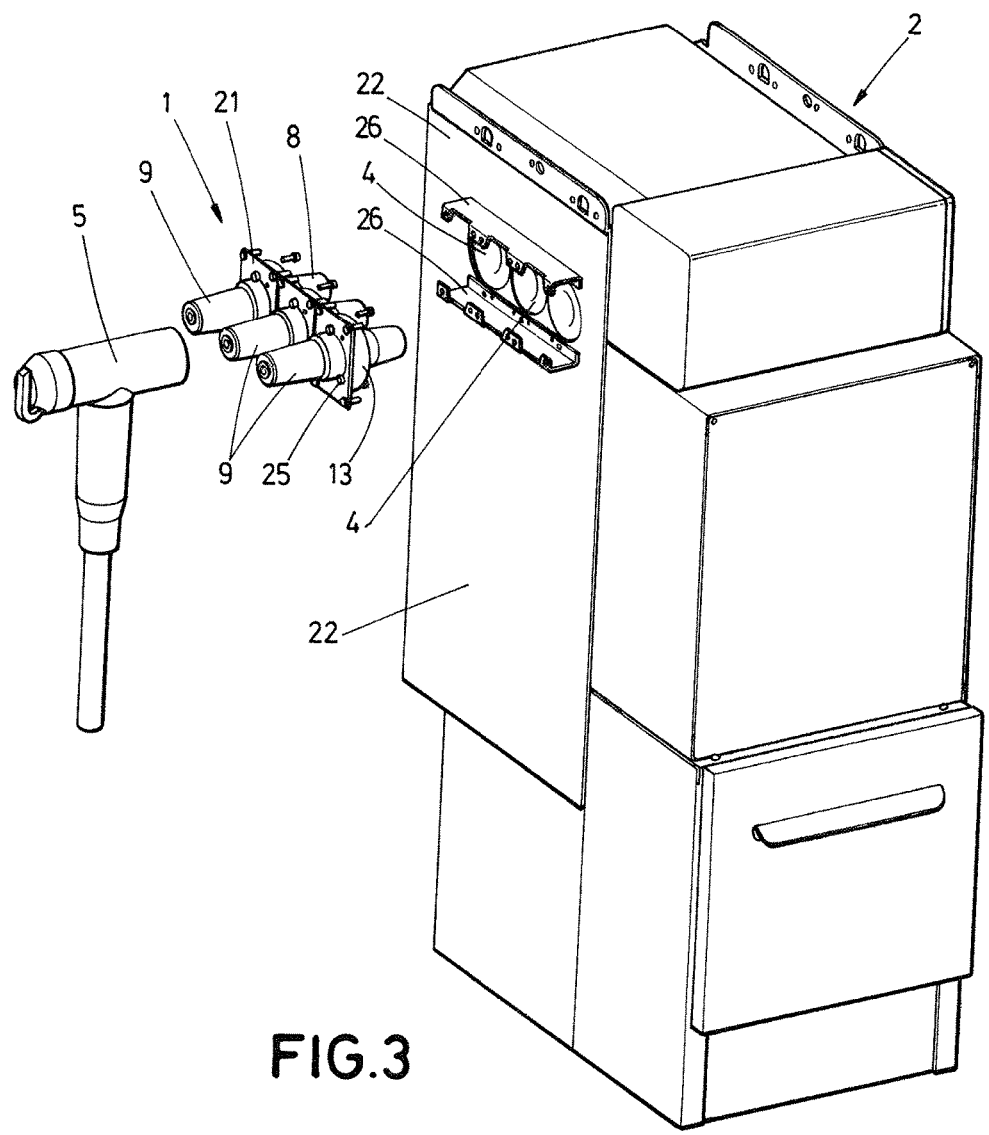
FIG. 3 shows an exploded view of one phase of the grid, revealing the adapter in accordance with a preferred embodiment.

In FIGS. 1 to 3 one may observe the invented electrical connection bushing adapter (1), which is intended to be installed between a cable (3) with a terminal (5) and a piece of high-voltage electrical equipment (2), enabling an insulated and shielded electrical connection to be made, and simultaneously supply voltage and current values at a connection point, said connection being made by means of the adapter (1) on at least one female electrical connection bushing (4) corresponding to at least one bar (24) of the main set of bars of the high-voltage electrical equipment (2), as shown in FIG. 3. Therefore, with the adapter (1) described herein it is possible to connect the cable (3) to the terminal (5) in the female bushing (4) of a piece of electrical equipment (2) that can be mounted in an on-site electrical installation.

More specifically, the invented adapter (1) comprises a body (6) of insulating material, equipped with a first connection end (8) configured to couple in a sealed manner into said at least one female electrical connection bushing (4) of the high-voltage electrical equipment (2) and with a second connection end (9) configured to couple to the female terminal (5) of the cable (3), as shown in FIG. 3. As is shown in FIGS. 1 and 2, the inside of the first connection end (8) is at least partially coated with a first conductive coating (12), and the outside is at least partially coated with a second conductive coating (13) that is at ground potential.

As may be seen in FIG. 2, the first connection end (8) is configured to be housed in the female bushing (4) and comprises a connector (14) encapsulated in the body (6) configured to connect to at least one conductive terminal (15) of said female bushing (4) when the first connection end (8) is coupled in a sealed manner into said at least one female electrical connection bushing (4) of the high-voltage electrical equipment (2).

Likewise, in FIG. 2, one may see that the connector (14) of the first connection end (8) comprises at least one conductive part (16) and at least one conductive ring (18), wherein the conductive parts (16) are mounted axially in openings (19) provided radially in the ring (18). Thus, the electrical connection between said at least one conductive part (16) and the conductive terminal (15) of the female bushing (4) is of the plug-in type, this electrical connection then being inside the insulating body (6) of the adapter (1). The connector (14) comprises at least one conductive tube (17) incorporating inside of it the aforementioned at least one conductive part (16), the connection point of the at least one conductive part (16) with the conductive terminal (15) therefore being located inside said conductive tube (17).

As for the second connection end (9) of the adapter (1) body (6), it comprises at least one encapsulated conductive bar (11) that is connected to the at least one conductive part (16) of the connector (14), this connection point also being located inside the conductive tube (17) that is at the same potential as the conductive parts (16).

To ensure suitable electrical contact between said conductive bar (11) and the conductive parts (16), as well as between said conductive parts (16) and the conductive terminal (15) of the female bushing (4), the connector (14) of the first connection end (8) comprises at least one elastic element (20) that tightens the assembly of conductive parts (16) against the conductive bar (11) and the conductive terminal (15) inside the conductive tube (17), as shown in FIG. 2.

The adapter (1) may also comprise at least one means for controlling the electric field (23), mounted at the point where the first connection end (8), the second connection end (9) and the conductive tube (17) of the connector (14) converge. This means for controlling the electric field (23) is at the same potential as the conductive tube (17), guaranteeing the control of the electrical field at said point.

In order to be able to measure voltage and current, it is envisaged that the adapter (1) may comprise at least one voltage sensor (7) encapsulated in the second connection end (9) of the body (6) and at least one current sensor (10) mounted on the second connection end (9) of the body (6), as shown in FIG. 2.

Lastly, as is shown in FIGS. 1 to 3, the adapter (1) comprises at least one fastening element (21), such as a metal sheet joined to the second connection end (9) by means of screws (25) such that, once the first connection end (8) is coupled in a sealed manner into the female electrical connection bushing (4), it enables the adapter (1) to be attached on a fastening support (26) of a wall (22) of the high-voltage electrical equipment (2), for example by means of screws, as shown in FIG. 3.

The invention claimed is:

1. An adapter (1) for an electrical connection bushing, with application in a connection point between a piece of high-voltage electrical equipment (2) independent from the adapter (1) and comprising at least one female electrical connection bushing (4), and at least one cable (3) independent from the adapter (1) and comprising a terminal (5), wherein the adapter (1) comprises a body (6) of insulating material, equipped with a first connection end (8) configured to couple in a sealed manner into said at least one female bushing (4) of the high-voltage electrical equipment (2) and with a second connection end (9) configured to couple to the female terminal (5) of the cable (3);

wherein the inside of the first connection end (8) is at least partially coated with a first conductive coating (12), and the outside of the first connection end (8) is at least partially coated with a second conductive coating (13);

wherein the first connection end (8) comprises a connector (14) encapsulated in the body (6) configured to connect to at least one conductive terminal (15) of said female bushing (4) when the first connection end (8) is coupled in a sealed manner into said at least one female electrical connection bushing (4) of the high-voltage electrical equipment (2);

wherein the connector (14) comprises conductive parts (16) and at least one conductive ring (18), the conductive parts (16) being mounted axially in openings (18) provided radially in the ring (18), and an electrical connection between said conductive parts (16) and the conductive terminal (15) is inside the insulating body (6);

wherein the second connection end (9) of the body (6) comprises at least one encapsulated conductive bar (11) that is connected to said conductive parts (16) of the connector (14);

wherein the connector (14) comprises at least one conductive tube (17), said conductive parts (16), which are mounted axially in the openings (18) provided radially in the ring (18); being incorporated inside said at least one conductive tube (17), and connection points of said conductive parts (16) with the conductive terminal (15) and the conductive bar (11), respectively, being located inside said at least one conductive tube (17);

wherein the adapter (1) further comprises at least one means for controlling an electric field (23), the at least one means for controlling the electric field (23) being mounted on said at least one conductive tube (17) and on the ring (18) to control the electric field at a point inside said at least one conductive tube (17) where the first connection end (8) and the second connection end (9) converge.

2. The adapter (1) according to claim 1, wherein the connector (14) comprises at least one elastic element (20)

that tightens the assembly of said conductive parts (16) against the conductive bar (11) and the conductive terminal (15) inside the conductive tube (17).

3. The adapter (1) according to claim 2, further comprising at least one fastening element (21) which enables, once the first connection end (8) is coupled in a sealed manner into the female bushing (4), the adapter (1) to be attached on a wall (22) of the high-voltage electrical equipment (2).

4. The adapter (1) according to claim 2, wherein the means for controlling the electric field (23) is at the same potential as the conductive tube (17), guaranteeing the control of the electrical field.

5. The adapter (1) according to claim 1, further comprising at least one voltage sensor (7) encapsulated in the second connection end (9) of the body (6).

6. The adapter (1) according to claim 5, further comprising at least one current sensor (10) mounted on the second connection end (9) of the body (6).

7. The adapter (1) according to claim 6, further comprising at least one fastening element (21) which enables, once the first connection end (8) is coupled in a sealed manner into the female bushing (4), the adapter (1) to be attached on a wall (22) of the high-voltage electrical equipment (2).

8. The adapter (1) according to claim 6, wherein the means for controlling the electric field (23) is at the same potential as the conductive tube (17), guaranteeing the control of the electrical field.

9. The adapter (1) according to claim 5, further comprising at least one fastening element (21) which enables, once the first connection end (8) is coupled in a sealed manner into the female bushing (4), the adapter (1) to be attached on a wall (22) of the high-voltage electrical equipment (2).

10. The adapter (1) according to claim 5, wherein the means for controlling the electric field (23) is at the same potential as the conductive tube (17), guaranteeing the control of the electrical field.

11. The adapter (1) according to claim 1, further comprising at least one fastening element (21) which enables, once the first connection end (8) is coupled in a sealed manner into the female bushing (4), the adapter (1) to be attached on a wall (22) of the high-voltage electrical equipment (2).

12. The adapter (1) according to claim 11, wherein the means for controlling the electric field (23) is at the same potential as the conductive tube (17), guaranteeing the control of the electrical field.

13. The adapter (1) according to claim 1, wherein the means for controlling the electric field (23) is at the same potential as the conductive tube (17), guaranteeing the control of the electrical field.

* * * * *